United States Patent [19]
Ziger et al.

[11] Patent Number: 5,976,741
[45] Date of Patent: *Nov. 2, 1999

[54] METHODS FOR DETERMINING ILLUMINATION EXPOSURE DOSAGE

[75] Inventors: David Ziger; Pierre Leroux, both of San Antonio, Tex.

[73] Assignee: VSLI Technology, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/955,473

[22] Filed: Oct. 21, 1997

[51] Int. Cl.$^6$ .................................................... G03F 9/00
[52] U.S. Cl. .............................................. 430/30; 382/145
[58] Field of Search ................................ 430/30; 382/145

[56] References Cited

PUBLICATIONS

Ralph Dammel, "Diazonaphthoquinone–Based Resists", 1993, p. 11 (Determination of Dose to Clear).

*Primary Examiner*—Christopher G. Young
*Attorney, Agent, or Firm*—Wells, St.John, Roberts, Gregory & Matkin, P.S.

[57] ABSTRACT

Semiconductor wafer processing methods are described. In one implementation, a semiconductor wafer is provided with a layer of photoresist thereover. A matrix is defined within the photoresist and comprises a plurality of exposed grating patterns which are formed through successive exposure passes of a mask which defines the grating pattern. The wafer is exposed to conditions which are effective to remove at least some of the photoresist and to clear substantially all of the photoresist over a wafer portion underlying at least one of the exposed grating patterns. The wafer is inspected and at least one processing parameter associated with photoresist which was removed during processing can be ascertained. In a preferred aspect, the processing parameter comprises an illumination exposure dosage. In a preferred implementation, two exposure passes with the mask are made with a second of the passes being shifted by a predetermined amount relative to the grating pattern defined by the first pass. The predetermined amount includes first and second adjustment amounts, with the first adjustment amount being equal to a pitch dimension of the mask, and the second adjustment amount being equal to a value associated with a difference between first and second stepping intervals.

43 Claims, 7 Drawing Sheets

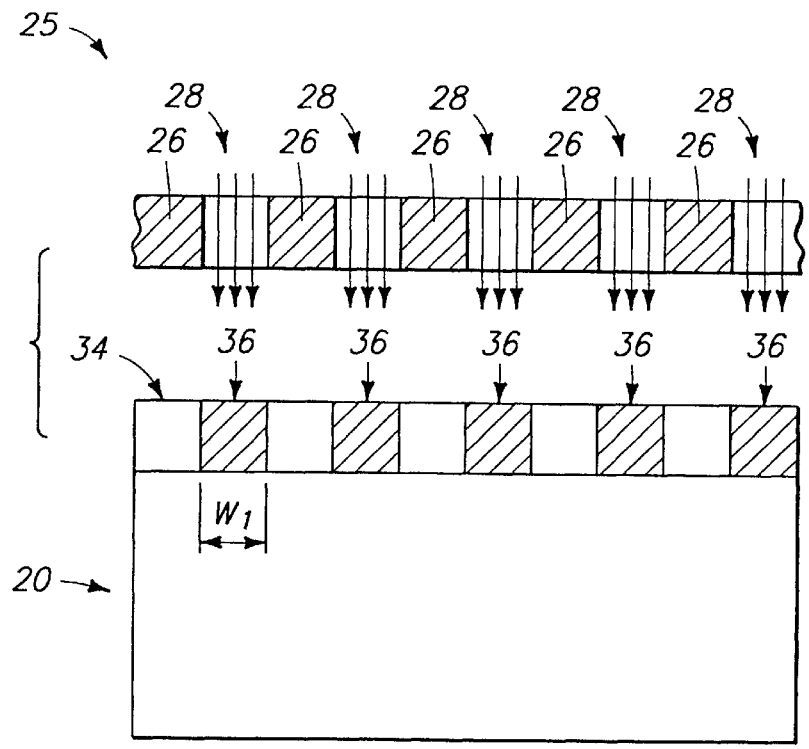
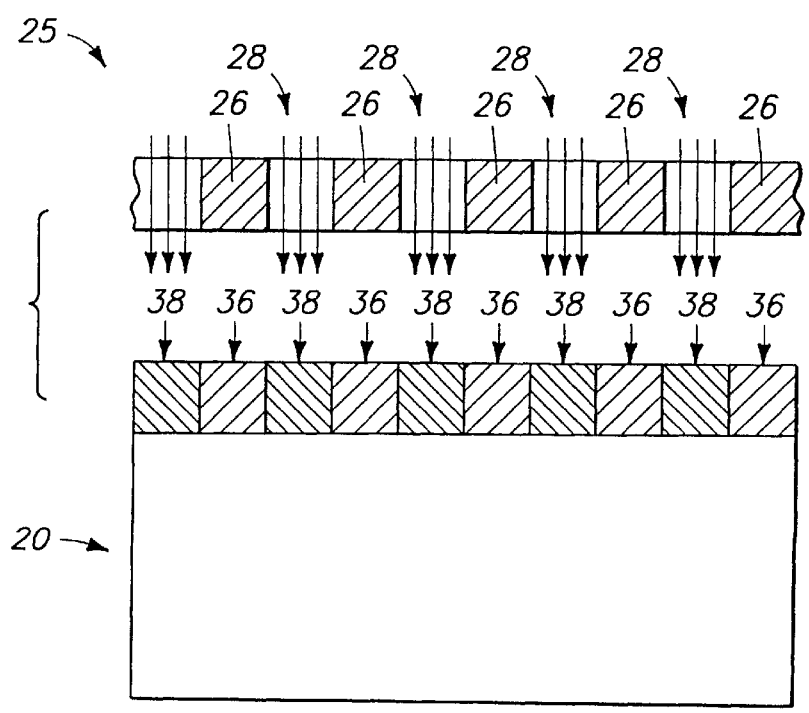

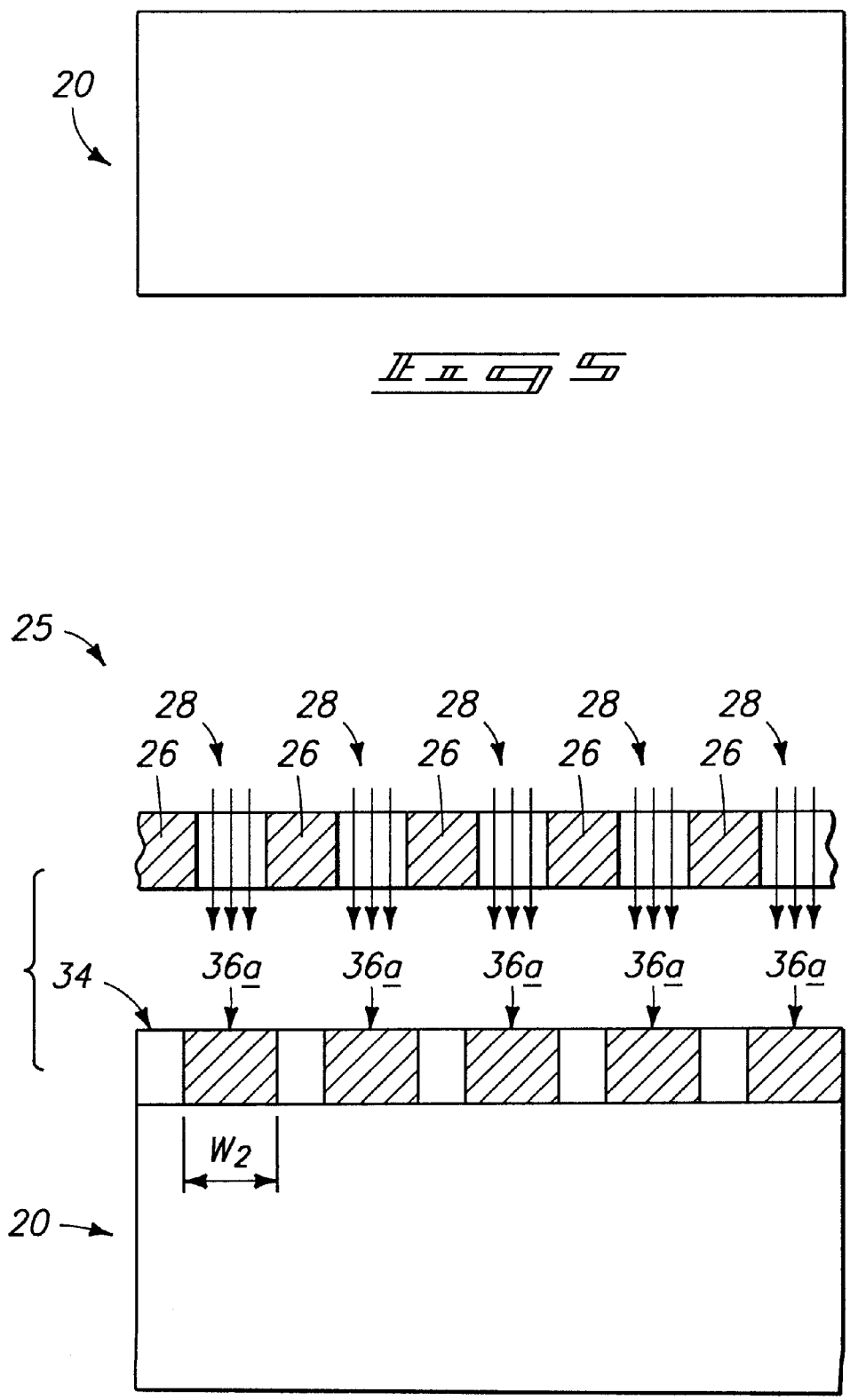

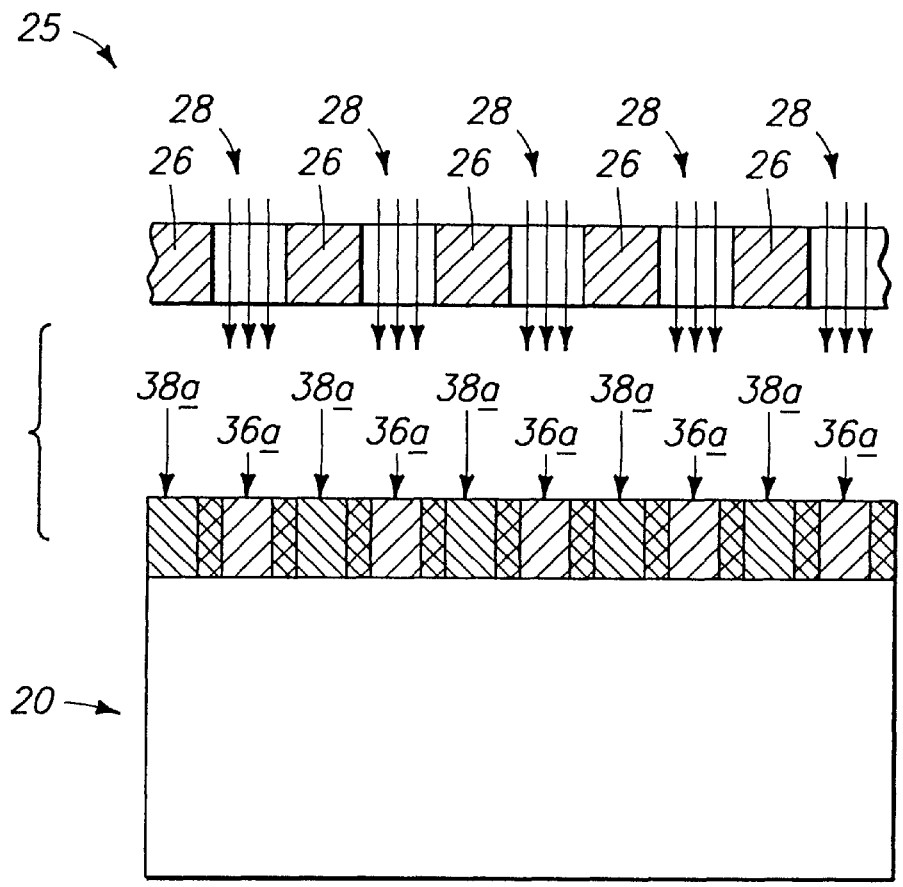
_Fig. 7_
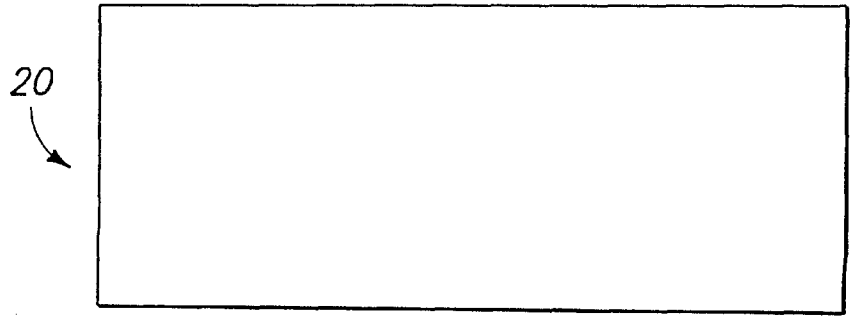
_Fig. 8_

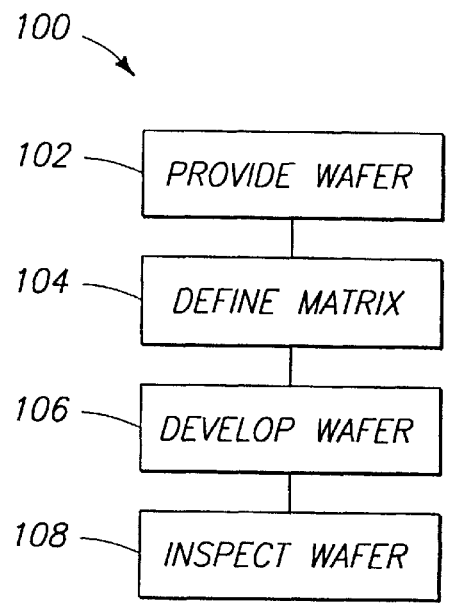
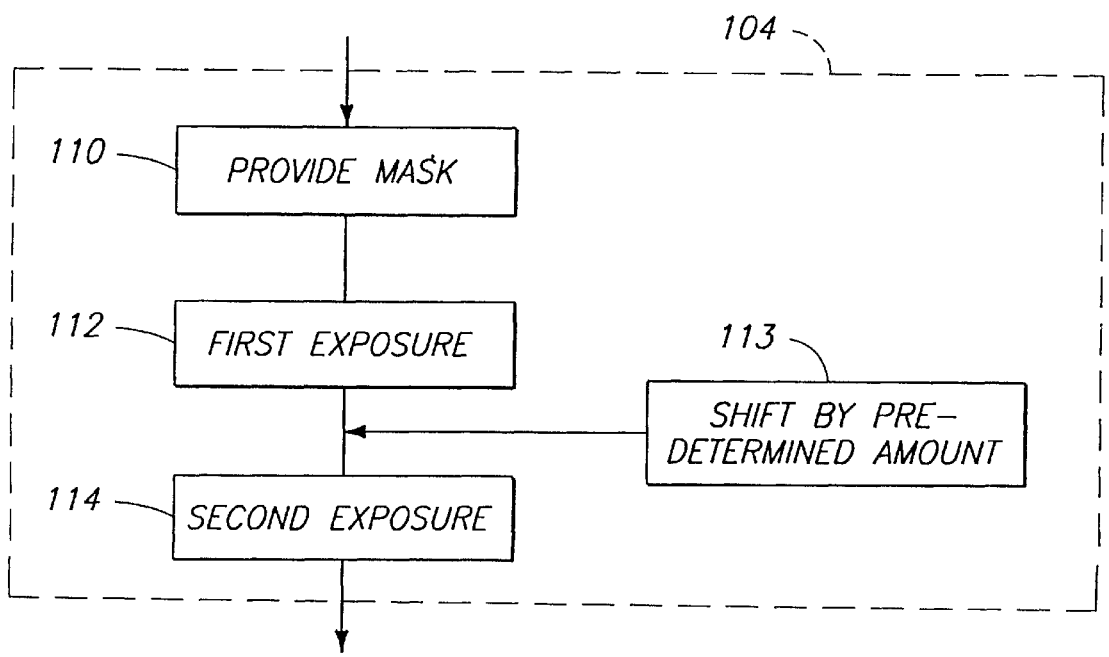

METHODS FOR DETERMINING ILLUMINATION EXPOSURE DOSAGE

TECHNICAL FIELD

This invention relates generally to methods of determining illumination exposure dosages and other processing parameters in the field of fabricating integrated circuits. More particularly, the invention concerns methods of processing semiconductor wafers in step and repeat systems.

BACKGROUND OF THE INVENTION

In the manufacture of most integrated circuits, particularly very large scale integrated circuits such as arrays of DRAMs (Dynamic Random Access Memory) or PROMs (Programmable Read Only Memory), numerous identical circuits are placed on the same wafer of semiconductor material. This is accomplished by creating various elements of the circuits in multiple layers. Each element is ordinarily produced by a lithographic process wherein an image of one or a few of the individual circuit elements is projected onto the wafer at a time with the wafer being secured to a movable stage. After a first projection is made, the stage is stepped to a new position where the same image is projected again. This process is typically repeated until all of the desired elements of that particular layer are imprinted on the wafer. That layer is then treated to form the desired elements and then subsequent layers of elements are added over the first until all of the elements of the circuit are produced.

Because of the high circuit density on the wafer and the need to make uniform and repeatable connections to the circuits thereon, it is very important that the masking material which is used to define such elements and connections be patterned in a manner which is repeatable and accurate. Typically, photoresist is used as a masking layer and is exposed to illumination through a mask which defines desired circuit elements and connections. Various processing parameters can affect the accuracy with which the photoresist can be patterned. For example, if a mask is misaligned, images will not be accurately reproduced within the photoresist. Similarly, if the illumination exposure dosage is too great or not enough, the photoresist will be over-exposed or underexposed respectively thereby rendering inaccurate images. Needless to say, maintaining accurate control over parameters such as illumination exposure dosage, light scattering, focus, and/or photoresist developing parameters is very important.

This invention arose out of concerns associated with providing methodologies that facilitate monitoring and control of semiconductor processing conditions.

SUMMARY OF THE INVENTION

Semiconductor wafer processing methods are described. In one implementation, a semiconductor wafer is provided with a layer of photoresist thereover. A matrix is defined within the photoresist and comprises a plurality of exposed grating patterns which are formed through successive exposure passes of a mask which defines the grating pattern. The wafer is exposed to conditions which are effective to remove at least some of the photoresist and to clear substantially all of the photoresist over a wafer portion underlying at least one of the exposed grating patterns. The wafer is inspected and at least one processing parameter associated with photoresist which was removed during processing can be ascertained. In a preferred aspect, the processing parameter comprises an illumination exposure dosage. In a preferred implementation, two exposure passes with the mask are made with a second of the passes being shifted by a predetermined amount relative to the grating pattern defined by the first pass. The predetermined amount includes first and second adjustment amounts, with the first adjustment amount being equal to a pitch dimension of the mask, and the second adjustment amount being equal to a value associated with a difference between first and second stepping intervals.

BRIEF DESCRIPTION OF THE DRAWINGS

Preferred embodiments of the invention are described below with reference to the following accompanying drawings.

FIGS. 3–11 are diagrammatic sectional views of an exemplary semiconductor wafer being processed in accordance with one aspect of the inventive methodologies.

FIGS. 13–14 are block diagrams which illustrate various aspects of the inventive methodologies.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
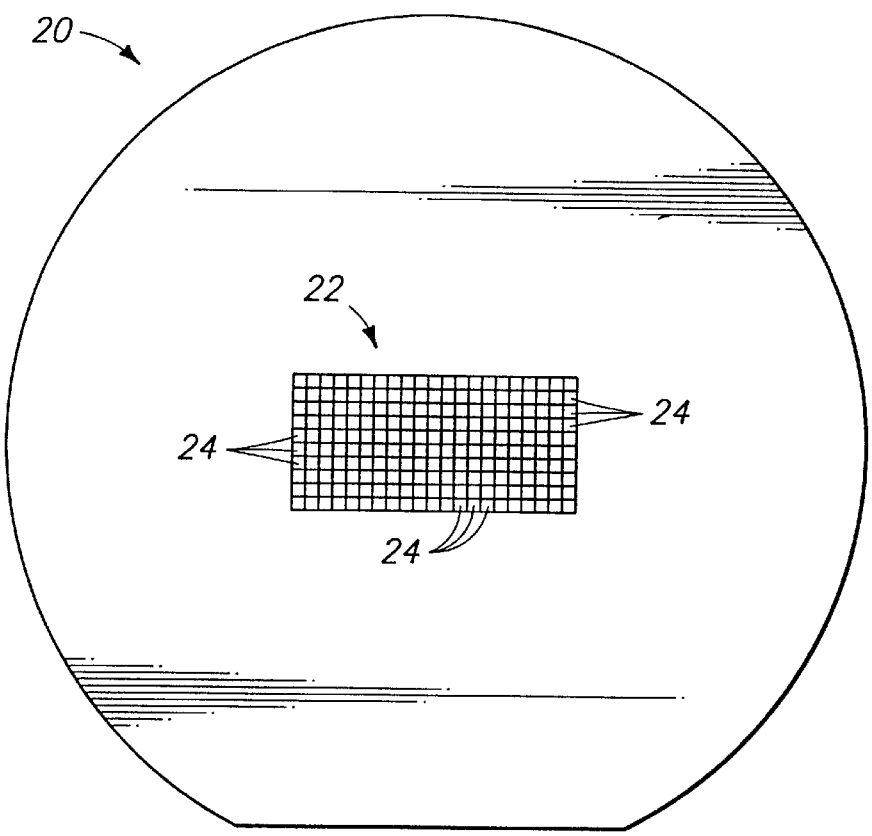
FIG. 1 is a plan view of a semiconductor wafer including a matrix of grating patterns formed in accordance with one aspect of the invention.

Referring to FIG. 1, a semiconductor wafer 20 is provided and a layer of photoresist is formed thereover. Preferably, wafer 20 is positioned on a stage of a step and repeat printer. A matrix 22 is defined over the wafer and within the photoresist through photolithographic techniques described just below. The matrix and the methodologies through which it can be formed enable photolithographic processing parameters to be ascertained, preferably visually with the naked eye. This constitutes one of the desirable improvements over methods in the past which required sophisticated metrology instruments to ascertain such parameters.

In the illustrated example, matrix 22 comprises a plurality of grating patterns 24 which are arranged in a plurality of rows and columns. Each grating pattern comprises a square which is 2 mm×2 mm in dimension. Matrix 22 includes twenty-one grating patterns in each individual horizontal row and ten grating patterns in each vertical column.

The formation of matrix 22 is preferably accomplished in a step and repeat fashion in which a single mask is utilized to define the matrix. Specifically, an individual grating pattern 24 is defined by exposing the photoresist through the mask to illumination conditions which are effective to transfer the pattern thereinto. The mask and/or wafer is repositioned or stepped to a next position so that a next wafer portion can be processed. Processing continues until a desired matrix is formed.

Figure 2:
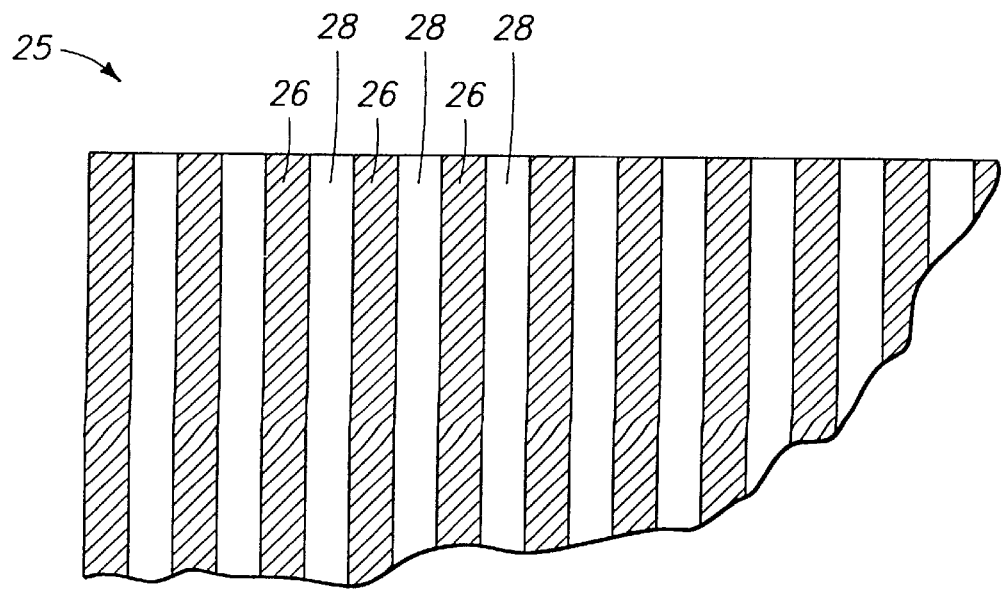
FIG. 2 is a plan view of a portion of a mask which can be utilized to produce individual grating patterns in accordance with one aspect of the invention.

An exemplary portion of a mask which is suitable for forming the above-described matrix is shown in FIG. 2 at 25. There, an exemplary grating pattern includes a plurality of elements 26 which are spaced apart from one another by a plurality of respective spaces 28. In the illustrated example, elements 22 comprise line features which are to be transferred into the photoresist as described below. The elements or lines are preferably evenly spaced and comprise width dimensions which are substantially equal. In the preferred mask, elements or lines 26 define a pitch which is equal to a width dimension of a individual element or line plus an adjacent space intermediate a next adjacent element or line. An exemplary line width dimension is 0.6 microns and an exemplary space width is 0.6 microns thereby resulting in a pitch of 1.2 microns.

Preferably, matrix 22 is formed through successive exposure passes with mask 25 in which the wafer is exposed to illumination conditions which are effective to transfer the grating pattern into the photoresist. Typically, a starting position is initiated at which exposure begins. Photoresist which overlies a particular wafer portion within what will become matrix 22 is exposed through the mask and then the stage is sequentially stepped to the next wafer portion with additional exposures following. After completing a row of grating patterns, the stage is stepped vertically to additional rows to complete the process for the entire matrix. In this way, the grating pattern is transferred in a first pass to the photoresist within matrix 22. In one aspect, the illumination exposure dosage can be varied over matrix 22 so that different parts of the wafer (and photoresist) receive a varied amount of illumination. The varying of the illumination exposure dosage permits some wafer parts to be overexposed, adequately exposed, and underexposed. By "overexposed" is meant that the photoresist receives an excess amount of illumination necessary to permit removal at a later point in processing. By "adequately exposed" is meant that the photoresist receives a sufficient amount of illumination to permit removal, but not too much. By "underexposed" is meant that the photoresist does not receive a sufficient amount of illumination to permit removal of all of the subject photoresist. Accordingly, some photoresist would be left behind.

In the illustrated example, the uppermost row of matrix 22 is exposed to a maximum dosage of illumination, with such dosages being decreased at each successive lower row. An exemplary dosage for the uppermost row is 310 milliseconds with successive dosages being decreased by 20 milliseconds per row. In the illustrated example, the first exposure pass in the step and repeat process has a first stepping interval of 2 mm. This means that after an exposure, the stage upon which the wafer is disposed is moved 2 mm to reposition the wafer for the next exposure.

After completion of the first illumination pass, matrix 22 is ready for a second illumination pass. The second illumination pass is one in which photoresist within matrix 22 is exposed through mask 25 to illumination conditions which are sufficient or effective to transfer at least portions of the grating pattern to the photoresist. Preferably, the second-exposed grating patterns which are formed in the second pass are shifted relative to the first-exposed grating patterns by a predetermined amount. The predetermined amount constitutes an adjustment amount by which the grating pattern is adjusted.

Referring to FIGS. 3–11, illustrative exposure passes have been set forth in accordance with one aspect of the invention to assist the reader in understanding the inventive methodologies. The figures illustrate different wafer portions which receive different exposure dosages during exemplary first and second passes. FIGS. 3–5 describe an adequately exposed wafer portion; FIGS. 6–8 describe an over-exposed wafer portion; and FIGS. 9–11 describe an under-exposed wafer portion.

Referring to FIGS. 3–5, first and second passes are respectively illustrated in FIG. 3 and FIG. 4, with a resultant wafer portion being indicated at FIG. 5 after suitable developing to remove the photoresist. FIG. 3 shows light from an illumination exposure dosage passing through spaces 28 intermediate lines 26 of mask 25. Underlying photoresist 34 is exposed over wafer portions which underlie openings 28. Exposed photoresist portions are indicated at 36 and define a width $w_1$, with unexposed photoresist portions being disposed thereadjacent and defining a similar width. Subsequently, mask 25 is shifted by a predetermined amount and a second pass is conducted in which photoresist portions 38 are exposed. In the illustrated example, the predetermined amount defines an adjustment amount which is equal to about one-half of the pitch defined by the mask. With the exposure dosage comprising a value which is sufficient to adequately expose the subject photoresist, all of the photoresist can be developed and removed as in FIG. 5. When the photoresist is developed off of a reflective substrate such as silicon, one can visually ascertain whether there remains any photoresist.

Referring to FIGS. 6–8, wafer 20 is exposed in substantially the same manner as in FIGS. 3–5, except that the illumination exposure dosage is sufficient to over-expose the subject photoresist. Accordingly, exposed photoresist portions 36a define respective widths $w_2$ which are somewhat greater than widths $w_1$ (when exposure is adequate). Subsequently, when the second pass is conducted, all of the remaining photoresist is exposed, or over-exposed, such that subsequent developing removes all of the photoresist from over the wafer. Such is shown in FIG. 8.

Figure 9:
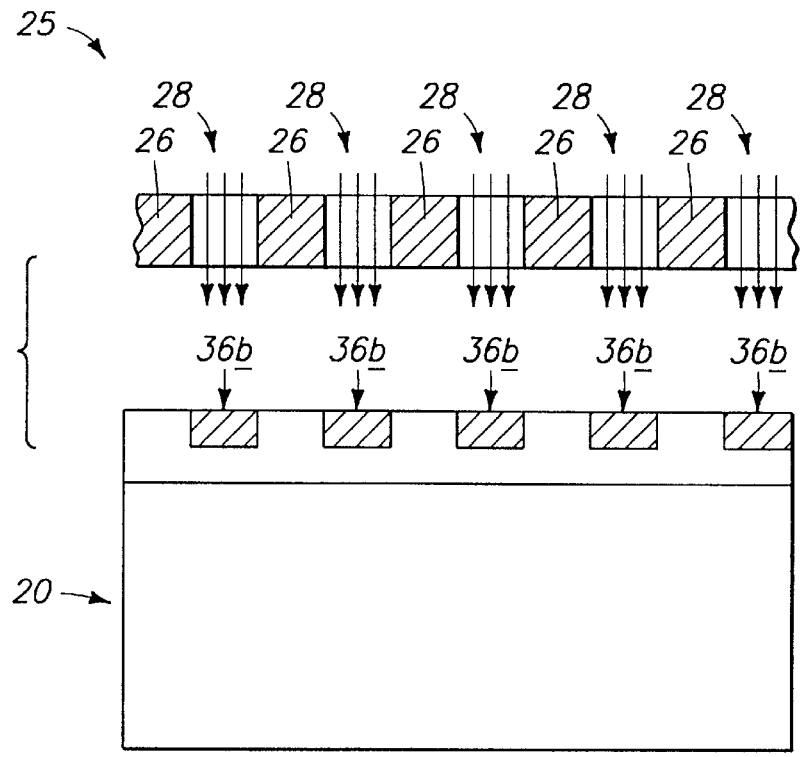
Figure 10:
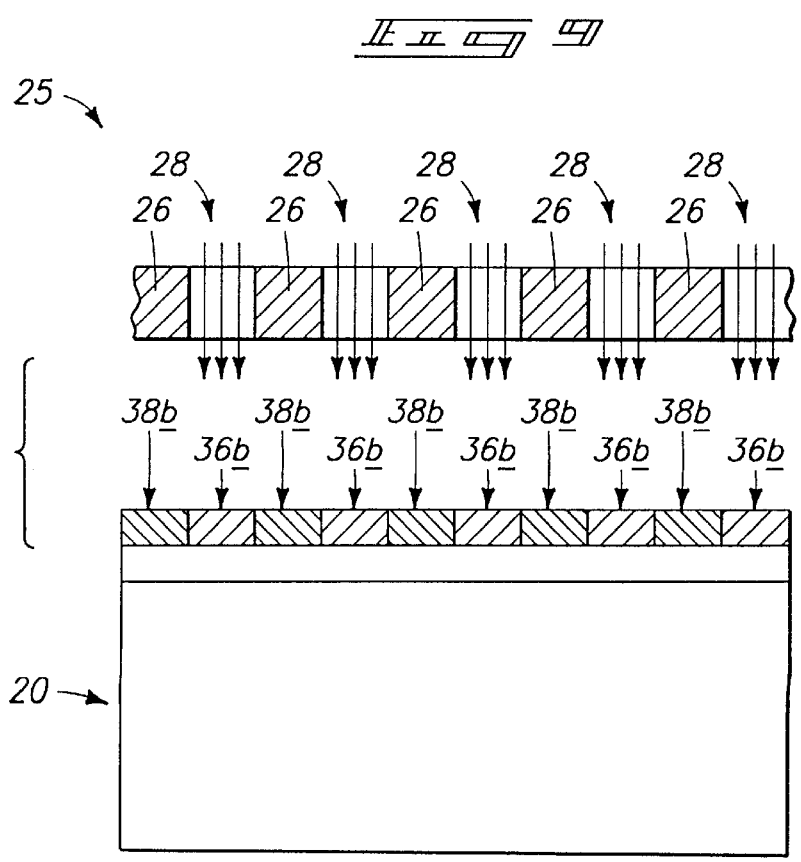
Figure 11:
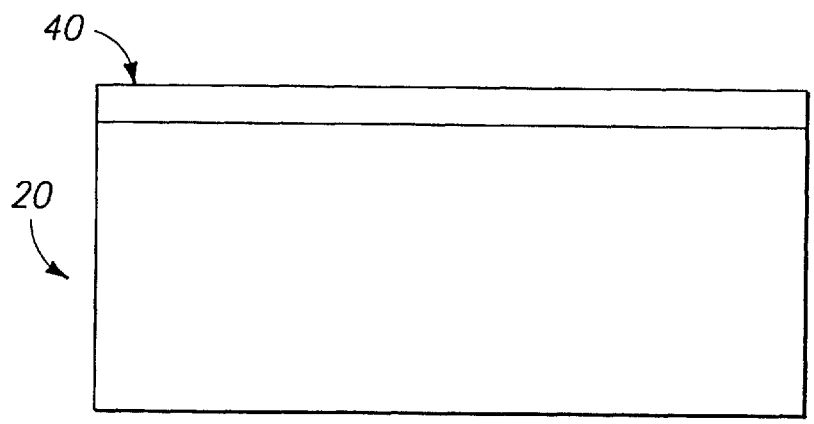

Referring to FIGS. 9–11, wafer 20 is exposed in substantially the same manner as in FIGS. 3–5, except that the illumination exposure dosage under-exposes the subject photoresist. Accordingly, exposed photoresist portions 36b have unexposed photoresist disposed thereunder. Subsequently, when the second pass is conducted, similar exposed photoresist portions 38b are formed with underlying unexposed photoresist. Subsequent development and removal of the photoresist results in remnant photoresist 40 (FIG. 11) remaining over the wafer. When the photoresist is formed over a reflective substrate, the presence of remnant photoresist can be detected by the unaided eye. Accordingly, wafer portions with adequate and inadequate illumination dosages can be ascertained. By knowing the illumination exposure dosages for a selected wafer portion over which photoresist is removed, one can accurately ascertain the appropriate dosage.

In a preferred aspect of the invention, the adjustment amount in the second pass comprises first and second adjustment amounts. The first adjustment amount corresponds to or is equal to about one-half of the pitch defined by mask 25. In the second pass however, the stepping interval of the step and repeat processing is changed or varied. Accordingly, the second adjustment amount corresponds to or is equal to about the absolute value of the difference between the first and second stepping intervals. In the illustrated example, and where the first stepping interval equals 2 mm, an exemplary second stepping interval equals 1.99998 mm for a difference of 0.02 microns. In the second pass, the illumination exposure dosage is the same as in the first pass, i.e. it is varied in the same amounts as in the first pass. Accordingly, some of the wafer portions in the uppermost part of matrix 22 will be over-exposed while some of the wafer portions in the lowermost part of matrix 22 will be under-exposed. In the over-exposed portions, all of the photoresist will be removed during subsequent developing, while some photoresist will remain over the underexposed portions. The reader is referred to our co-pending application Ser. No. 08/729,963 entitled "Method for Measuring Alignment Accuracy in a Step and Repeat System", filed on Oct. 15, 1996 and assigned to the assignee of this patent application, the disclosure of which is incorporated by reference. That disclosure discusses methodologies in which alignment errors and other processing parameters can be determined.

Figure 12:
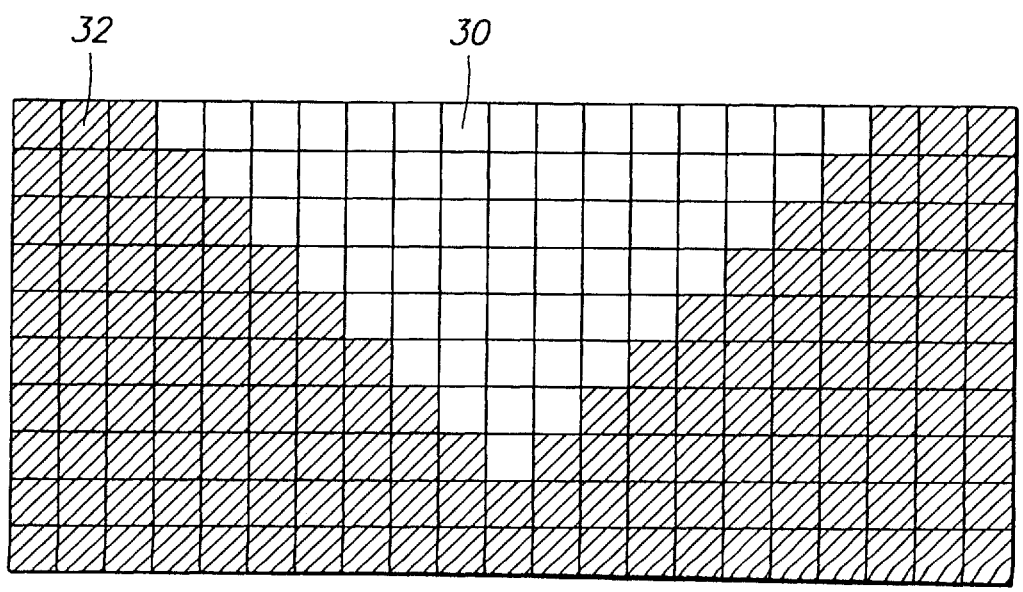
FIG. 12 is an enlarged schematic plan view of a matrix which has been processed in accordance with a preferred aspect of the invention.

Referring to FIG. 12, an exemplary wafer processed in accordance with the above methodology is shown. Individual wafer portions over which the photoresist was previously formed and subsequently removed are shown as open squares 30. Wafer portions over which the photoresist was not removed are shown as shaded squares 32. The wafer portions over which the photoresist was removed collectively define a "V" having a vertex which appears in the third row from the bottom as the eleventh square. This square defines the wafer portion over which an adequate illumination exposure dosage was utilized to expose the photoresist. By knowing the variable illumination exposure dosages which were utilized to form the matrix, one can ascertain an accurate dosage amount. In the lines above the third row, where there is a greater illumination exposure dosage, the number of cleared patterns increases as the illumination dosage increases. On the other hand, when the illumination dosage is insufficient, as in the first and second rows from the bottom, none of the cells or wafer portions are cleared.

The entire display is easily visible on the developed wafer with a separation between those patterns still having resist thereon being ascertainable through visual inspection with the naked eye. As the exposure dosages for each row are known, one can ascertain by determining the location of the vertex wafer portion, an illumination dosage amount which was sufficient to clear that particular portion. Accordingly, one can ascertain without the use of ancillary metrology equipment an accurate illumination dosage. Alternately, the wafer can be inspected through utilization of an appropriate reflectometer which can be used to locate one or more selected wafer portions which have been cleared.

Referring to FIGS. 13 and 14, a preferred aspect of the abovedescribed methodologies is set forth in block diagram form generally at 100. A wafer or other suitable substrate is provided at 102 and includes a masking material such as photoresist formed thereover. A matrix or other suitable patterned structure is formed within the photoresist at 104. An exemplary matrix is described above. At 106, the exposed photoresist is developed which results in some, but not all of the photoresist being removed. At 108, an inspection of the wafer is undertaken to identify those wafer portions over which photoresist has been removed, and those wafer portions over which photoresist remains. The inspection can be a visual inspection or one which utilizes a instrument such as a reflectometer. Preferred aspects of the formation of the matrix at 104 are set forth in more detail in FIG. 14. There, a mask is provided at 110. Preferably the mask contains or defines a pattern which is capable of being replicated over the wafer and into the photoresist. An exemplary mask configuration is described above. Utilizing the mask in a step and repeat system, a first exposure pass is conducted in which the photoresist on the wafer is exposed to define a matrix. The illumination exposure dosage can be, and preferably is varied over the course of forming the matrix. In one aspect, the wafer is not removed from the stage of the step and repeat system upon which it is disposed, and a second pass is conducted at 114. The second pass preferably uses the same mask and the same illumination exposure dosage profile as in the first pass. The second pass, however, is preferably shifted relative to the first pass by a predetermined amount. The preferred predetermined amount takes into account a shift of approximately one half of a pitch defined by the mask as well as an adjustment in the stepping interval utilized to replicate the pattern over the matrix. Thus, a desired matrix is exposed which is subsequently developed and inspected as described above. Other processing regimes are possible without departing from the scope of the invention.

One advantage of the above-described methodology is that such methodology integrates a number of factors which are important to pattern definition, yet can be visually measured at a magnification factor of 1. Accordingly, processing parameters such as light scattering or focus can be taken into account. Moreover, other processing variables such as post exposure bake or photoresist develop time can be correlated more closely through the above described methodology.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A calibration determination method for a step and repeat printer for use in processing semiconductor wafers comprising:

providing a semiconductor wafer with a layer of photoresist thereover;

defining a matrix over a portion of the wafer and within the photoresist, the matrix comprising a plurality of exposed grating patterns formed through successive exposure passes of a mask over the portion and defining a grating pattern using the step and repeat printer;

exposing the wafer to conditions effective to remove at least some of the photoresist from over the wafer and to clear substantially all of the photoresist over a wafer portion underlying at least one of the exposed grating patterns; and inspecting the wafer to determine positions of fully exposed gratings on the wafer.

2. The method of claim 1, wherein defining comprises conducting two exposure passes over the portion with said mask.

3. The method of claim 1, wherein defining comprises conducting said successive exposure passes with said mask in a step and repeat fashion.

4. The method of claim 3, wherein one of said successive exposure passes defines grating patterns which are offset from another of the successive passes by a predetermined distance.

5. The method of claim 4, wherein said defining comprises conducting two exposure passes with said mask.

6. The method of claim 4, wherein an individual grating pattern comprises a plurality of spaced-apart elements within said grating pattern, said spaced-apart elements defining a pitch which is equal to a width dimension of an individual element plus an adjacent space intermediate a next adjacent element, and said predetermined distance comprises an adjustment which is approximately equal to one half of said pitch.

7. The method of claim 6, wherein said spaced-apart elements comprise line features.

8. The method of claim 1, wherein said inspecting comprises visually inspecting for said selected wafer portion.

9. The method of claim 1, wherein said inspecting comprises utilizing a reflectometer to locate said selected wafer portion.

10. A calibration determination method for a step and repeat printer for use in processing semiconductor wafers comprising:
providing a semiconductor wafer with a layer of photoresist thereover;
providing a mask defining a grating pattern to be transferred into the photoresist layer;
first exposing the wafer through the mask to illumination conditions effective to transfer the grating pattern into the photoresist over a wafer portion, and repeating said exposing over other wafer portions, the wafer portions collectively defining a matrix including rows and columns of the grating pattern;
second exposing photoresist within the matrix through the mask to illumination conditions effective to transfer at least portions of the grating pattern into the photoresist over the wafer portion, second-exposed grating patterns being shifted by a predetermined amount relative to first-exposed grating patterns to form a complement of the grating pattern in at least one column of the matrix;
developing the photoresist sufficiently to effectively remove photoresist over a plurality of wafer portions and to expose associated underlying substrate portions; and
observing the wafer and photoresist to determine positions of fully exposed grating patterns thereon.

11. The method of claim 10, wherein said providing of the mask comprises providing a mask having a grating pattern defined at least in part by a plurality of lines and spaces.

12. The method of claim 11, wherein said lines and spaces define a pitch which is equal to a width dimension of an individual line plus an adjacent space intermediate a next adjacent line, and said predetermined amount by which said second-exposed grating patterns are shifted is about one half of said pitch.

13. The method of claim 12, wherein:
first exposing comprises exposing the wafer in a step and repeat fashion having a first stepping interval;
second exposing comprises exposing the wafer in a step and repeat fashion having a second stepping interval different from the first stepping interval; and
wherein the difference between the first and second stepping intervals is a fraction of the predetermined amount.

14. The method of claim 10, wherein first exposing comprises decreasing an illumination exposure dosage from one row of the matrix to the next.

15. The method of claim 14, wherein providing the mask comprises providing a mask having a grating pattern defined at least in part by a plurality of lines and spaces, said lines and spaces defining a pitch equal to a width dimension of an individual line plus an adjacent space intermediate a next adjacent line, and said predetermined amount by which said second-exposed grating patterns are shifted about one half of said pitch.

16. The method of claim 15, wherein:
said first exposing comprises exposing the wafer in a step and repeat fashion having a first stepping interval;
said second exposing comprises exposing the wafer in a step and repeat fashion having a second stepping interval which is different from the first stepping interval by an amount that is a fraction of the pitch; and
wherein said adjustment amount defines a first adjustment amount, and said predetermined amount comprises a second adjustment amount which is equal to about the absolute value of the difference between the first and second stepping intervals.

17. The method of claim 10, wherein said second exposing comprises varying an illumination exposure dosage from one row to another row over the matrix.

18. The method of claim 17, wherein said providing of the mask comprises providing a mask having a grating pattern defined at least in part by a plurality of lines and spaces, said lines and spaces defining a pitch, and said predetermined amount by which said second-exposed grating patterns are shifted comprises an adjustment amount equal to about one half of said pitch.

19. The method of claim 18, wherein:
said first exposing comprises exposing the wafer in a step and repeat fashion having a first stepping interval;
said second exposing comprises exposing the wafer in a step and repeat fashion having a second stepping interval which is different from the first stepping interval by a fraction of the pitch; and
wherein said adjustment amount defines a first adjustment amount, and said predetermined amount comprises a second adjustment amount which is equal to about the absolute value of the difference between the first and second stepping intervals.

20. The method of claim 10, wherein:
said first exposing comprises varying an illumination exposure dosage from one row to another over the matrix; and
said second exposing comprises varying an illumination exposure dosage from one row to another over the matrix.

21. The method of claim 20, wherein said providing of the mask comprises providing a mask having a grating pattern defined at least in part by a plurality of lines and spaces, said lines and spaces defining a pitch, and said predetermined amount by which said second-exposed grating patterns are shifted comprises an adjustment amount equal to about one half of said pitch.

22. The method of claim 21, wherein: said first exposing comprises exposing the wafer in a step and repeat fashion having a first stepping interval;
said second exposing comprises exposing the wafer in a step and repeat fashion having a second stepping interval which is different from the first stepping interval by a fraction of the pitch; and
wherein said adjustment amount defines a first adjustment amount, and said predetermined amount comprises a second adjustment amount which is equal to about the absolute value of the difference between the first and second stepping intervals.

23. A method of processing a semiconductor wafer in a step and repeat printer comprising:
positioning a semiconductor wafer with a layer of photoresist thereover at an initial position on a stage of a step and repeat printer;
forming a first matrix of first grating patterns arranged in rows and columns over the wafer and within the photoresist layer using a step and repeat process having a first stepping interval and starting from the initial position;

forming a second matrix of first grating patterns over the wafer and within the first matrix, starting from a position offset from the initial position by a first amount and using a second stepping interval which is different from the first stepping interval by a fraction of the first amount;

developing the photoresist; and examining the wafer to ascertain positions of fully exposed gratings on the wafer.

24. The method of claim 23, wherein the forming of the first and second grating patterns comprises providing a single mask defining a desired grating pattern and exposing the photoresist through the mask to illumination conditions effective to transfer said respective grating patterns into the photoresist.

25. The method of claim 24, wherein said desired grating pattern is defined at least in part by a plurality of lines and spaces defining a pitch.

26. The method of claim 24 further comprising varying an illumination exposure dosage from one row to another row during the forming of at least one of the first and second grating patterns.

27. The method of claim 26, wherein said varying comprises varying said illumination exposure dosage during formation of both of the first and second grating patterns such that each grating pattern comprising the matrix has the same exposure dosage during formation of the first and second grating patterns.

28. The method of claim 25 wherein starting from a position offset from the initial position by a first amount comprises offsetting the second grating pattern from the first grating pattern by one-half of the pitch, wherein, in at least one column of the matrix, the second grating pattern includes a complement to the first grating pattern.

29. The method of claim 28, wherein said desired grating pattern is defined at least in part by a plurality of lines and spaces, said lines and spaces defining a pitch, and said predetermined amount comprises an adjustment amount equal to about one half of the pitch.

30. The method of claim 24 further comprising, prior to the forming of the second grating pattern, offsetting the wafer by a predetermined amount equal to a fraction of the pitch relative to the mask.

31. The method of claim 30, wherein said desired grating pattern is defined at least in part by a plurality of lines and spaces defining a pitch, and said predetermined amount comprises an adjustment amount equal to about one half of the pitch.

32. The method of claim 23, wherein said examining of the wafer comprises visually examining the wafer.

33. The method of claim 23, wherein said examining of the wafer comprises utilizing a reflectometer to examine the wafer.

34. A method of processing a semiconductor wafer in a step and repeat printer comprising:

positioning a semiconductor wafer with a layer of photoresist thereover on a stage of a step and repeat printer;

forming a matrix of rows and columns of first grating patterns over the wafer and within the photoresist layer using a step and repeat process having a first stepping interval;

forming a plurality of second grating patterns over the wafer and within the matrix using a step and repeat process having a second stepping interval which is different from the first stepping interval by an amount that is smaller than a smallest dimension of the first grating pattern to provide at least one column where the first and second grating patterns are complementary;

developing the photoresist; and visually examining the wafer to determine positions of fully exposed gratings thereon and determining therefrom at least one processing parameter associated with photoresist which was removed during said developing.

35. The method of claim 34, wherein the forming of the first and second grating patterns comprises providing a single mask defining a desired grating pattern and exposing the photoresist through the mask to illumination conditions effective to transfer said respective grating patterns into the photoresist, said at least one processing parameter comprising an illumination scattering parameter.

36. The method of claim 34, wherein the forming of the first and second grating patterns comprises providing a single mask defining a desired grating pattern and exposing the photoresist through the mask to illumination conditions effective to transfer said respective grating patterns into the photoresist, said at least one processing parameter comprising an illumination focussing parameter.

37. The method of claim 34, wherein the forming of the first and second grating patterns comprises providing a single mask defining a desired grating pattern and exposing the photoresist through the mask to illumination conditions effective to transfer said respective grating patterns into the photoresist, said at least one processing parameter comprising an illumination dosage parameter.

38. The method of claim 37, wherein said desired grating pattern is defined at least in part by a plurality of lines and spaces, said lines and spaces defining a pitch.

39. A method of measuring photolithographic corrections using a step and repeat printer comprising:

positioning a wafer coated with photoresist on a stage of the step and repeat printer at a first starting position;

exposing the wafer a first time to an exposure matrix formed from a row of gratings each formed from line and space features having a pitch, the exposure matrix of gratings being repeated over a first portion of the wafer starting from the first starting position in a step and repeat fashion in a first direction and having a first stepping interval and a first illumination dose;

exposing the wafer a second time to the exposure matrix over the row of the wafer using the illumination dose previously used for the first portion and starting from a second starting position complementary to the first starting position using a second stepping interval that differs from the first stepping interval by a fraction of the pitch; and observing the wafer to determine positions of fully exposed gratings on the wafer.

40. The method of claim 39 further comprising:

exposing the wafer a third time to an exposure matrix formed from a second row of gratings, the gratings forming the second row being repeated over a second portion of the wafer starting from a position offset from the first position in a second direction orthogonal to the first direction and in a step and repeat fashion in the first direction having the first stepping interval and at a second illumination dose less than the first exposure dose; and exposing the wafer a fourth time to the exposure matrix over the second row with the second stepping interval at the second illumination dose and starting from a second starting position complementary to the first starting position using a second stepping interval that differs from the first stepping interval by a fraction of the pitch.

41. A method of measuring photolithographic corrections using a step and repeat printer comprising:

providing a semiconductor wafer with a layer of photoresist thereover;

exposing, using a first dose, a series of portions of the photoresist through a mask in a step and repeat fashion to define a first series of matrices within the photoresist, each matrix within the first series comprising a grating pattern having a pitch and having a first offset from a nearest neighbor matrix;

exposing, using the first dose, the series of portions of the photoresist through the mask in a step and repeat fashion to define a second series of matrices within the photoresist, each matrix within the second series having a second offset from a nearest neighbor, wherein the second offset differs from the first offset by fraction of the pitch, to cause some portions of some of the series of portions of the photoresist to be double exposed;

developing the photoresist to remove at least some of the photoresist from over the wafer and to clear substantially all of the photoresist over a wafer portion underlying at least one of the series of portions; and inspecting the wafer to determine positions of fully exposed gratings on the wafer.

42. The method of claim 41, further comprising, prior to developing:

exposing, using a second dose different than the first dose, a second series of portions of the photoresist through the mask in a step and repeat fashion to define a second series of matrices within the photoresist, each matrix within the second series comprising a plurality of exposed grating patterns having a pitch and having a first offset from a nearest neighbor matrix; and exposing, using the second dose, the series of portions of the photoresist through the mask in a step and repeat fashion to define a second series of matrices within the photoresist, each matrix within the second series having a second offset from a nearest neighbor, wherein the second offset differs from the first offset by fraction of the pitch, to cause some portions of some of the series of portions of the photoresist to be double exposed.

43. A method of measuring photolithographic corrections using a step and repeat printer comprising:

exposing a region of photoresist-coated semiconductor wafer with a pattern by projecting an array of rows and columns of sets of grating features formed from lines and spaces having a pitch using a first stepping distance and using an increased exposure dosage from row to row of the array;

re-exposing the region by projecting the first array but using a different stepping distance along the rows and also using an offset in starting positions of the exposure and re-exposure to form a phase difference between the exposure and the re-exposure which results in a complementary alignment of the exposure and the re-exposure in at least one column of the array; and inspecting the wafer to determine positions of fully exposed gratings on the wafer.

* * * * *